US012635245B2

(12) United States Patent
Luo

(10) Patent No.: US 12,635,245 B2
(45) Date of Patent: May 19, 2026

(54) DISPLAY PANEL AND DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Chuanbao Luo, Shenzhen (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 552 days.

(21) Appl. No.: 18/149,062

(22) Filed: Dec. 30, 2022

(65) Prior Publication Data

US 2024/0213259 A1      Jun. 27, 2024

(30) Foreign Application Priority Data

Dec. 22, 2022    (CN) .......................... 202211657450.9

(51) Int. Cl.
| | |
|---|---|
| *H10D 86/60* | (2025.01) |
| *H10D 30/67* | (2025.01) |
| *H10D 86/01* | (2026.01) |
| *H10D 86/40* | (2025.01) |
| *H10F 30/282* | (2025.01) |
| *H10F 77/166* | (2025.01) |

(52) U.S. Cl.
CPC ......... *H10D 86/60* (2025.01); *H10D 30/6723* (2025.01); *H10D 30/6755* (2025.01); *H10D 86/0221* (2025.01); *H10D 86/423* (2025.01);

*H10D 86/425* (2025.01); *H10D 86/441* (2025.01); *H10F 30/282* (2025.01); *H10F 77/166* (2025.01)

(58) Field of Classification Search
None
See application file for complete search history.

(56) References Cited

U.S. PATENT DOCUMENTS

| | | | | |
|---|---|---|---|---|
| 2011/0284722 A1* | 11/2011 | Ahn | ........................ | H03K 17/78 |
| | | | | 250/214 R |
| 2012/0138919 A1* | 6/2012 | Lan | ........................ | H04N 25/76 |
| | | | | 257/43 |
| 2013/0036400 A1* | 2/2013 | Bak | ........................... | G06F 8/71 |
| | | | | 717/101 |
| 2013/0063400 A1* | 3/2013 | Ahn | ........................ | G06F 3/0412 |
| | | | | 250/206 |
| 2014/0098311 A1* | 4/2014 | Lim | ................... | G02F 1/136209 |
| | | | | 445/24 |
| 2015/0001527 A1* | 1/2015 | Tsang | ..................... | H10H 29/10 |
| | | | | 257/43 |

(Continued)

*Primary Examiner* — Erik T. K. Peterson
(74) *Attorney, Agent, or Firm* — PV IP PC; Peter Stecher; Wei Te Chung

(57) ABSTRACT

The present application provides a display panel and a display device. The display panel includes a substrate and a plurality of light-sensing units disposed on the substrate. The light-sensing unit includes a light-sensing transistor and a reading transistor connected in series. The light-sensing transistor includes a first active layer. The reading transistor includes a second active layer. A material of the first active layer and a material of the second active layer are both oxide semiconductors.

20 Claims, 6 Drawing Sheets

2/21

(56)          References Cited

U.S. PATENT DOCUMENTS

| 2015/0145840 A1* | 5/2015 | Lim ................... H10D 30/6755 |
| | | 345/207 |
| 2016/0282975 A1* | 9/2016 | Wu ....................... G06F 3/0412 |
| 2018/0138210 A1* | 5/2018 | Yuan .................... H10D 86/411 |
| 2021/0005771 A1* | 1/2021 | Tsubuku .............. G02F 1/1333 |
| 2023/0071859 A1* | 3/2023 | Park ...................... H10D 86/60 |

* cited by examiner

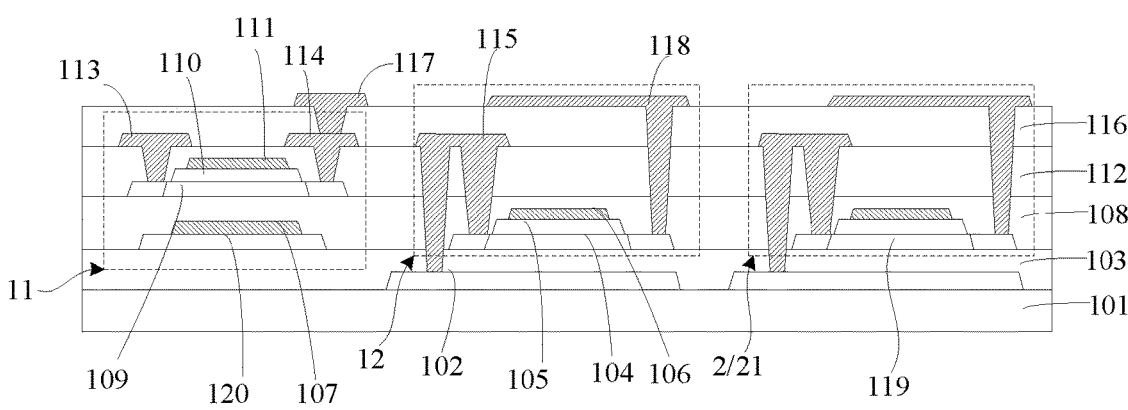
FIG. 5
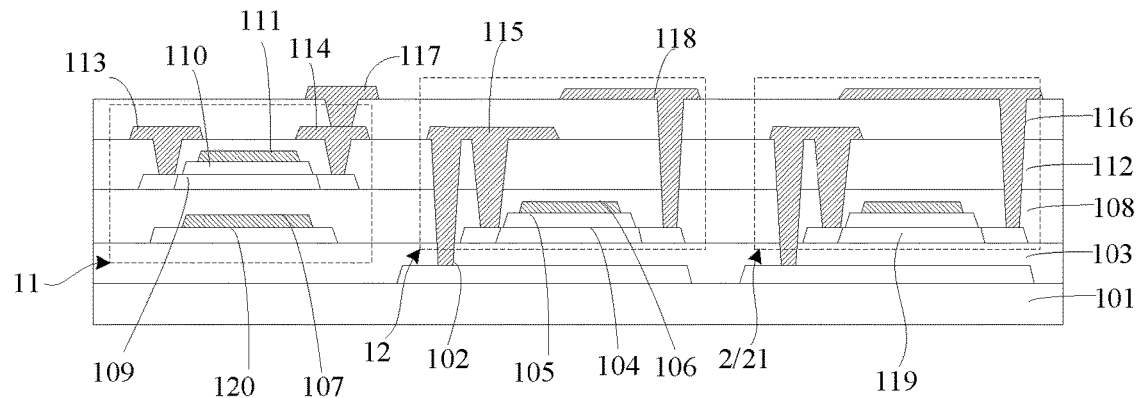
FIG. 6
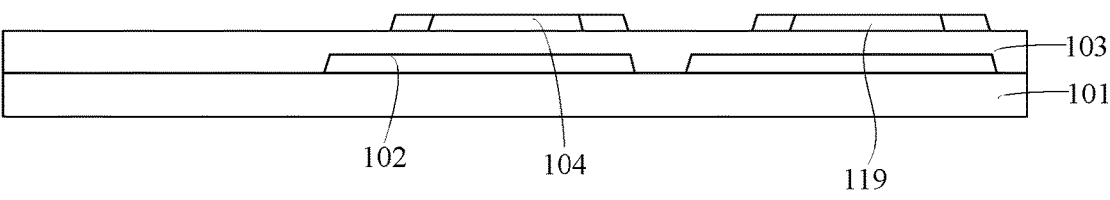
FIG. 7A
FIG. 7B

DISPLAY PANEL AND DISPLAY DEVICE

TECHNICAL FIELD

The present application relates to the technical field of display, in particular to a display panel and a display device.

BACKGROUND

A display panel includes a driving backplate for driving the display panel to display and light-sensing units that can interact with laser pens. A light-sensing unit includes a light-sensing transistor and a reading transistor. A material of an active layer of the light-sensing transistor is amorphous silicon (a-Si), and a material of an active layer of the reading transistor is an oxide semiconductor. However, there is a problem of poor process compatibility between the amorphous silicon and the oxide semiconductor.

SUMMARY

Embodiments of the present application provides a display panel and a display device to solve a technical problem of poor process compatibility between amorphous silicon and oxide semiconductor in display panels and display devices of the prior art.

To solve the above-mentioned problem, technical solutions provided by the present application are as following.

The present application provides the display panel, the display panel includes a substrate and a plurality of light-sensing units disposed on the substrate, each of the light-sensing units includes a light-sensing transistor and a reading transistor connected in series, the light-sensing transistor includes a first active layer, and the reading transistor includes a second active layer; and wherein a material of the first active layer and a material of the second active layer are both oxide semiconductors.

According to the display panel provided by the present application, a Fermi energy level of the material of the first active layer is greater than a Fermi energy level of the material of the second active layer, and an oxygen vacancy concentration of the material of the first active layer is greater than an oxygen vacancy concentration of the material of the second active layer.

According to the display panel provided by the present application, the light-sensing transistor further includes a first gate insulating layer and a first gate electrode, the first gate insulating layer covers the first active layer, and the first gate electrode is disposed on a side of the first gate insulating layer away from the substrate, and wherein the first gate electrode is made of a transparent material.

According to the display panel provided by the present application, the reading transistor further includes a second gate insulating layer and a second gate electrode, the second gate insulating layer covers the second active layer, and the second gate electrode is disposed on a side of the second gate insulating layer away from the substrate, and wherein the second gate electrode is made of an opaque material.

According to the display panel provided by the present application, the display panel further includes a first interlayer dielectric layer, the first active layer is disposed on a side of the first interlayer dielectric layer away from the substrate, and the first interlayer dielectric layer covers the second gate electrode.

According to the display panel provided by the present application, the light-sensing transistor further includes a first source electrode and a first drain electrode, and the reading transistor further includes a second source electrode and a second drain electrode;

wherein the display panel further includes a second interlayer dielectric layer, the second interlayer dielectric layer covers the first gate electrode, and the first source electrode, the first drain electrode, and the second source electrode are all disposed on a surface of a side of the second interlayer dielectric layer away from the substrate; and wherein an orthographic projection of one of the second source electrode and the second drain electrode on the substrate covers an orthographic projection of a channel of the second active layer on the substrate.

According to the display panel provided by the present application, the display panel further includes a protective layer, the protective layer covers the first source electrode, the first drain electrode, and the second source electrode; and wherein the second drain electrode is disposed on a surface of a side of the protective layer away from the substrate, and is electrically connected to an end of the second active layer through a via passing through the protective layer, the second interlayer dielectric layer, and the first interlayer dielectric layer.

According to the display panel provided by the present application, an orthographic projection of another one of the second source electrode and the second drain electrode on the substrate does not overlap with the orthographic projection of the channel of the second active layer on the substrate.

According to the display panel provided by the present application, the display panel further includes a buffer layer, and the buffer layer is disposed between the second active layer and the substrate; and the light-sensing transistor further includes a third gate insulating layer and a third gate electrode, the third gate insulating layer is disposed on a surface of a side of the buffer layer away from the substrate, the third gate electrode is disposed on a surface of a side of the third gate insulating layer away from the substrate, and the first interlayer dielectric layer covers the third gate electrode.

According to the display panel provided by the present application, the reading transistor further includes a light-shielding layer, the light-shielding layer is disposed between the substrate and the buffer layer, and an orthographic projection of the light-shielding layer on the substrate covers an orthographic projection of the second active layer on the substrate; and wherein the second source electrode is electrically connected to the light-shielding layer through a through-hole passing through the second interlayer dielectric layer, the first interlayer dielectric layer, and the buffer layer.

According to the display panel provided by the present application, the display panel further includes a driving unit disposed on the substrate, the driving unit includes a driving transistor, the driving transistor includes a third active layer, and a material of the third active layer is an oxide semiconductor; and wherein an oxygen vacancy concentration of the material of the first active layer is greater than an oxygen vacancy concentration of the material of the third active layer, and a Fermi energy level of the material of the first active layer is greater than a Fermi energy level of the material of the third active layer.

According to the display panel provided by the present application, each film layer of the driving transistor and corresponding film layer of the reading transistor are disposed in a same layer.

The present application provides the display device, the display device includes the above-mentioned display panel.

Beneficial effects of the present application are as following: the display panel and the display device provided by the present application includes the substrate and the plurality of light-sensing units disposed on the substrate, each of the light-sensing units includes the light-sensing transistor and the reading transistor connected in series. Compared with the prior art in which a material of the first active layer is amorphous silicon and a material of the second active layer is an oxide semiconductor, by adopting oxide semiconductors as the material of the first active layer of the light-sensing transistor and the material of the second active layer of the reading transistor, the defect of poor process compatibility between the amorphous silicon and the oxide semiconductor can be overcome, which is conducive to improving stability of devices.

BRIEF DESCRIPTION OF DRAWINGS

In order to explain technical solutions in the embodiments of the present application more clearly, the following will briefly introduce the drawings needed to be used in description of the embodiments. Obviously, the drawings in the following description are only some embodiments of the present application. For those skilled in the art, other drawings can be obtained from these drawings without paying creative effort.

FIG. 5 is a third schematic sectional structural diagram of the display panel provided by the embodiment of the present application.

FIG. 6 is a fourth schematic sectional structural diagram of the display panel provided by the embodiment of the present application.

FIG. 7A to FIG. 7I is a schematic flow structural diagram of a manufacturing method of a display panel provided by an embodiment of the present application.

Figure 1:
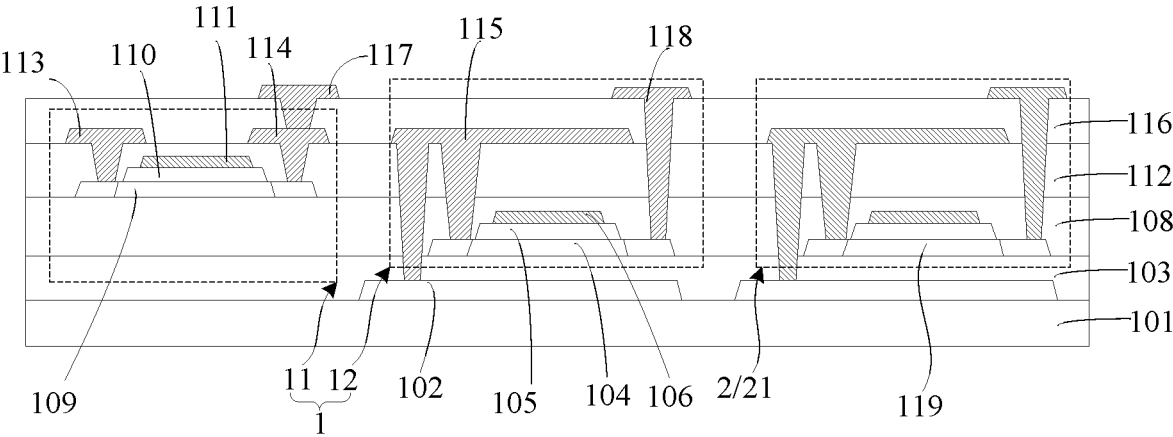
FIG. 1 is a first schematic sectional structural diagram of a display panel provided by an embodiment of the present application.

REFERENCE NUMERALS 1, light-sensing unit; 11, light-sensing transistor; 12, reading transistor; 2, driving unit; 21, driving transistor; 101, substrate; 102, light-shielding layer; 103, buffer layer; 104, second active layer; 105, second gate insulating layer; 106, second gate electrode; 107, third gate electrode; 108, first interlayer dielectric layer; 109, first active layer; 110, first gate insulating layer; 1101, first insulating part; 111, first gate electrode; 112. second interlayer dielectric layer; 113, first source electrode; 114, first drain electrode; 115, second source electrode; 116, protective layer; 117, signal reading wiring; 118, second drain electrode; 119, third active layer; 120, third gate insulating layer.

DETAILED DESCRIPTION OF EMBODIMENT

In combination with drawings in the embodiments of the present application, technical solutions in the embodiments of the present application will be described clearly and completely. Obviously, the described embodiments are only part of the embodiments of the present application, not all of them. Based on the embodiments of the present application, all other embodiments obtained by those skilled in the art without creative effort belong to a scope of the present application. In addition, it should be understood that specific embodiments described herein are only used to explain and interpret the present application and are not used to limit the present application. In the present application, location terms used, such as "up" and "down", generally refer to up and down in actual using or working state of devices, in particular drawing directions in the drawings, unless otherwise described; terms "inside" and "outside" refer to outlines of the devices.

Figure 2:
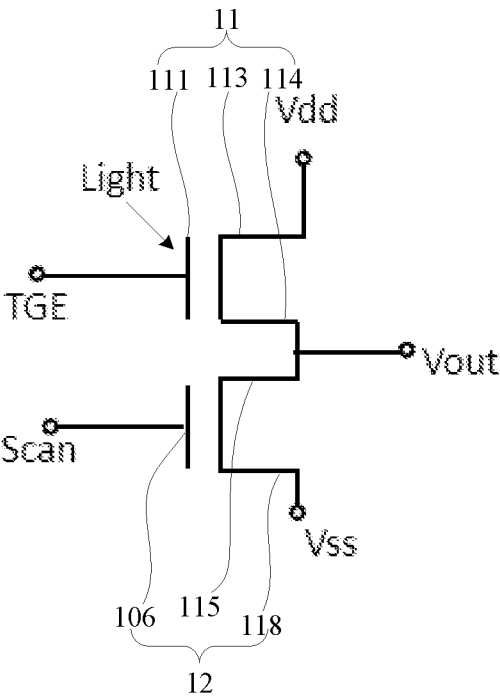
FIG. 2 is a schematic diagram of a circuit structure of a light-sensing unit of the display panel in FIG. 1.

Please refer to FIG. 1 and FIG. 2, an embodiment of the present application provides a display panel. The display panel includes a substrate 101 and a plurality of light-sensing units 1 disposed on the substrate 101. A light-sensing unit 1 includes a light-sensing transistor 11 and a reading transistor 12 connected in series. The light-sensing transistor 11 includes a first active layer 109. The reading transistor 12 includes a second active layer 104.

In the embodiment, a material of the first active layer 109 and a material of the second active layer 104 are both oxide semiconductors. Compared with the prior art in which a material of the first active layer 109 is amorphous silicon and a material of the second active layer 104 is an oxide semiconductor, a defect of poor process compatibility between the amorphous silicon and the oxide semiconductor can be overcame in the present application, which is conducive to improving stability of devices.

It should be noted that the light-sensing transistor 11 and the reading transistor 12 cooperate with each other to receive and read external light signals outside the display panel, respectively. In detail, the light-sensing transistor 11 is configured to receive a light signal generated by an external light source and convert the light signal into an electrical signal. The reading transistor 12 is configured to read voltages transmitted to it, and transmit the voltages to an external circuit, so as to realize positioning and sensing of the light signal irradiated to the light-sensing transistor 11, so that position information of the external light source can be accurately judged. The external light source may include a laser pen, and the light signal may come from the laser pen.

In the embodiment, the display panel further includes a plurality of driving units 2 and a plurality of pixel units (not shown in the drawings) disposed on the substrate 101. The plurality of driving units 2 are disposed in an array. The plurality of pixel units are disposed in an array. Each driving unit 2 is electrically connected to at least one pixel unit to drive the pixel unit to emit light, thereby enabling the display panel to achieve screen display.

It can be understood that the light-sensing unit 1 in the embodiment is integrated on the display panel, and the light-sensing unit 1 may be prepared synchronously with the driving unit 2. Compared with a way of hanging the light-sensing unit 1 on the display panel in the prior art, a separate process does not need to prepare the light-sensing unit 1, which can simplify a preparation process and is conducive to improving integration of the display panel.

It can be understood that the higher a Fermi energy level of a material of an active layer of a transistor is, the higher mobility of the transistor is, and the easier it is to be excited by light to cause a negative drift of a threshold voltage. In the embodiment, a Fermi energy level of the material of the first active layer 109 is greater than a Fermi energy level of the material of the second active layer 104, so as to ensure that mobility of the light-sensing transistor 11 is greater than mobility of the reading transistor 12, so that the light-sensing transistor 11 is easily excited by light to enable the threshold voltage drift negatively. That is, since a threshold voltage of a high mobility device has a characteristic of negative drift under illumination, it can be used as the first active layer 109 of the light-sensing transistor 11.

In the embodiment, the material of the first active layer 109 is an amorphous oxide semiconductor with high mobility or other types of semiconductors, and a form of the material may be crystalline or amorphous. For example, the material of the first active layer 109 may include indium gallium zinc oxide (IGTO), indium gallium oxide (IGO), indium zinc oxide (IZO), GTO, or other metal oxides with high a Fermi energy level and narrow band gap.

It can be understood that the less an oxygen vacancy concentration of a material of an active layer of a transistor is, the higher stability of the transistor is, and the un-easier it is to be interfered by light, so that a change of sensing signals can be obtained more accurately. In the embodiment, an oxygen vacancy concentration of the material of the first active layer 109 is greater than an oxygen vacancy concentration of the material of the second active layer 104, so as to ensure that stability of the reading transistor 12 is greater than stability of the light-sensing transistor 11. That is to say, since a high stability device has high stability, it can be used as the second active layer 104 of the reading transistor 12, so that the change of the sensing signals can be more accurately obtained, so as to judge the position information of the external light source.

In the embodiment, the material of the second active layer 104 includes high mobility and high stability semiconductors such as crystalline oxide semiconductors, amorphous oxide semiconductors, or other types of semiconductors. For example, the material of the second active layer 104 may include indium gallium zinc oxide (IGZO), indium gallium zinc titanium oxide (IGZTO), aluminum oxide tin zinc oxide (ATZO), lanthanide, or other rare earth metal oxides with low leakage current or wide band gap.

A specific film structure of the display panel is described in detail.

Please continue to refer to FIG. 1. The light-sensing transistor 11 in the embodiment is a top-gate structure. In detail, the light-sensing transistor 11 further includes a first gate insulating layer 110 and a first gate electrode 111. The first gate insulating layer 110 covers the first active layer 109. The first gate electrode 111 is disposed on a side of the first gate insulating layer 110 away from the substrate 101. The first gate electrode 111 is made of a transparent material, and external light signals emitted from a side of the display panel away from the substrate 101 can penetrate the first gate electrode 111 to illuminate the first active layer 109, so as to avoid the first gate electrode 111 from shielding the external light signals, which is conducive to improving light-sensing efficiency of the light-sensing transistor 11.

Optionally, a material of the first gate electrode 111 may include one or more combinations of a transparent metal or a metal oxide material such as indium tin oxide (ITO), IZO, aluminum doped zinc oxide (AZO), ANCL (a mixture of AL, Ni, Cu, and La), etc.

In the embodiment, the reading transistor 12 is also a top-gate structure. In detail, the reading transistor 12 further includes a second gate insulating layer 105 and a second gate electrode 106. The second gate insulating layer 105 covers the second active layer 104. The second gate electrode 106 is disposed on a side of the second gate insulating layer 105 away from the substrate 101. The second gate electrode 106 is made of an opaque material, so as to shield external light signals emitted from a side of the display panel away from the substrate 101. The external light signals cannot penetrate the second gate electrode 106 to illuminate the second active layer 104, so as to avoid affecting a device performance of the second active layer 104.

Optionally, a material of the second gate electrode 106 may be one or more combinations of Mo, Mo/Al, Mo/Cu, MoTi/Cu, MoTi/MoTi, Ti/Al/Ti, Ti/Cu/Ti, Mo/Cu/IZO, IZO/Cu/IZO, and Mo/Cu/ITO.

In the embodiment, the display panel further includes a first interlayer dielectric layer 108. The first active layer 109 is disposed on a side of the first interlayer dielectric layer 108 away from the substrate 101. The first interlayer dielectric layer 108 covers the second gate electrode 106.

The light-sensing transistor 11 further includes a first source electrode 113 and a first drain electrode 114. The reading transistor 12 further includes a second source electrode 115 and a second drain electrode 118. The display panel further includes a second interlayer dielectric layer 112. The second interlayer dielectric layer 112 covers the first gate electrode 111. The first source electrode 113, the first drain electrode 114, and the second source electrode 115 are all disposed on a surface of a side of the second interlayer dielectric layer 112 away from the substrate 101.

Please refer to FIG. 2. The first source electrode 113 and the first drain electrode 114 are electrically connected. The first gate electrode 111 is configured to receive a first scanning signal. The second gate electrode 106 is configured to receive a second scanning signal. The first source electrode 113 is configured to receive a high-level voltage signal Vdd. The second drain electrode 118 is configured to receive a low-level voltage signal Vss. The first gate electrode 111 is configured to receive a high-level scanning signal. The first drain electrode 114 is electrically connected to the second source electrode 115 and a signal reading end of the reading transistor 12.

A working process of the light-sensing unit 1 is described as following.

The light-sensing transistor 11 and the reading transistor 12 are connected in series, which can be regarded as two resistors connected in series. The light-sensing transistor 11 is in a turn-on state, when illuminated by light, since the material of the first active layer 109 of the light-sensing transistor 11 has a high Fermi energy level, the light-sensing transistor 11 is easily excited by light to enable a threshold voltage drift negatively. At this time, a voltage of the signal reading end of the reading transistor 12 increases, and a voltage signal is sensed by an external circuit, thus completing receiving and reading of light signal. Through a series of matrix structures of the light-sensing unit 1, position information of the external light source can be judged by a switching condition of the light-sensing transistor 11, thus realizing an active positioning of a position of an external visible light-spot, satisfying remote interaction, and greatly improving an interaction performance and an added value of the display panel.

Figure 3:
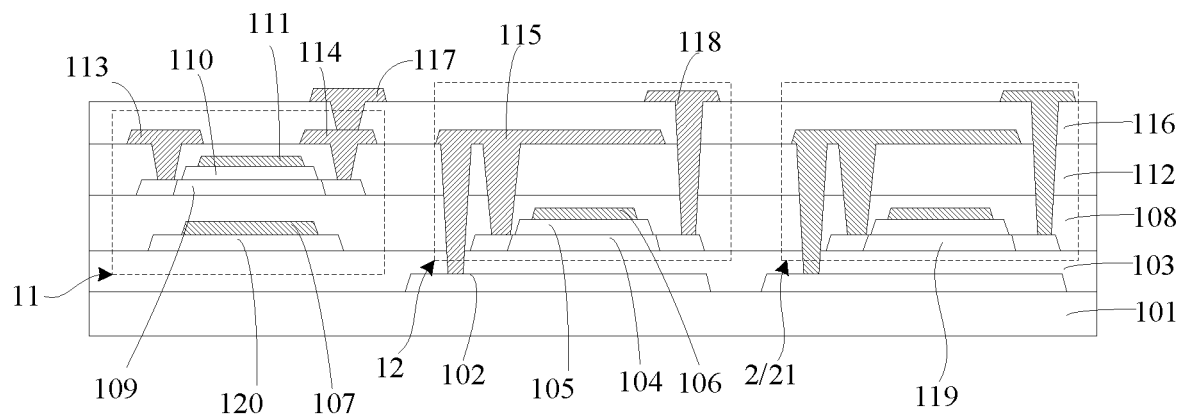
FIG. 3 is a second schematic sectional structural diagram of the display panel provided by the embodiment of the present application.
Figure 4:
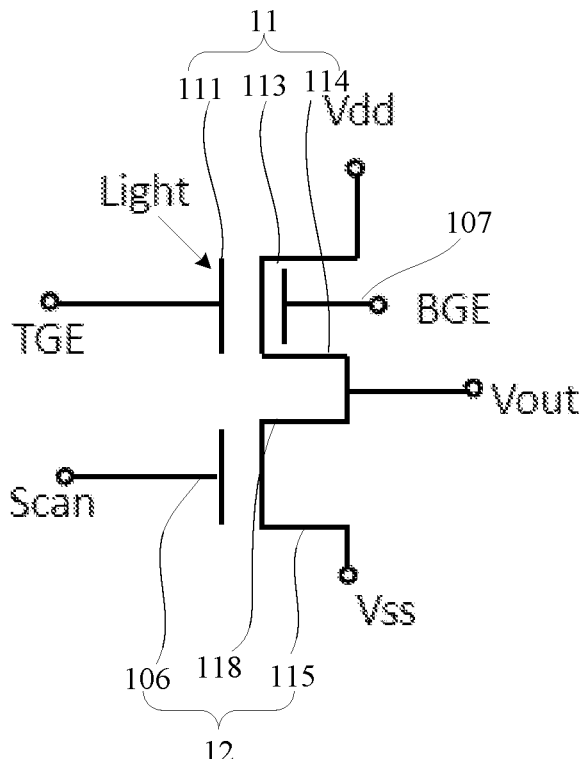
FIG. 4 is a schematic diagram of a circuit structure of a light-sensing unit of the display panel in FIG. 3.

Please refer to FIG. 3 and FIG. 4. A difference between FIG. 3 and FIG. 1 and a difference between FIG. 4 and FIG. 2 are that the light-sensing transistor 11 adopts a double-gate structure. In detail, the light-sensing transistor 11 further includes a third gate insulating layer 120 and a third gate electrode 107. The third gate insulating layer 120 is disposed on a surface of a side of the buffer layer 103 away from the substrate 101. The third gate electrode 107 is disposed on a surface of a side of the third gate insulating layer 120 away from the substrate 101. The first interlayer dielectric layer 108 covers the third gate electrode 107. It can be understood that the first gate electrode 111 is a transparent top-gate structure, and the third gate electrode 107 is a bottom-gate structure. That is, the light-sensing transistor 11 in the embodiment adopts a combination of the transparent top-gate structure and the bottom-gate structure, which is conducive to improving controllability of negative drift of a threshold voltage of the light-sensing transistor 11 under illumination.

In an embodiment, a top light-shielding layer is disposed above the reading transistor 12 to shield external light, so as to improve stability of the reading transistor 12 and prevent the external light from affecting the second active layer 104 of the reading transistor 12.

In another embodiment, please continue to refer to FIG. 1 and FIG. 3. An orthographic projection of the second source electrode 115 and an orthographic projection of the second drain electrode 118 on the substrate 101 cover an orthographic projection of a channel of the second active layer 104 on the substrate 101. A reason for the above-mentioned arrangement is that the channel of the second active layer 104 is covered by the second source electrode 115 and the second drain electrode 118, since the second source electrode 115 and the second drain electrode 118 can shield external light, an additional top light-shielding layer does not need to be disposed on a side of the second active layer 104 away from the substrate 101. In addition, an arrangement of the second source electrode 115 and the second drain electrode 118 can prevent water vapor from invading the channel of the second active layer 104, which is conducive to further improving the stability of the reading transistor 12.

In an embodiment, the second drain electrode 118 and second source electrode 115 may be disposed in a same layer, which is conducive to saving a manufacturing process. In another embodiment, as shown in FIG. 1 and FIG. 3, the second drain electrode 118 and the second source electrode 115 may be disposed in different layers, which is conducive to improving stability.

Taking the second drain electrode 118 and the second source electrode 115 being disposed in different layers as an example for illustration.

The display panel further includes a protective layer 116. The protective layer 116 covers the first source electrode 113, the first drain electrode 114, and the second source electrode 115, so as to protect the light-sensing unit 1 and the driving unit 2 from being invaded by outside air and water vapor. The second drain electrode 118 is disposed on a surface of a side of the protective layer 116 away from the substrate 101, and is electrically connected to an end of the second active layer 104 through a via passing through the protective layer 116, the second interlayer dielectric layer 112, and the first interlayer dielectric layer 108.

The orthographic projection of one of the second source electrode 115 and the second drain electrode 118 on the substrate 101 covers the orthographic projection of the channel of the second active layer 104 on the substrate 101, including following embodiments, and will be described one by one below.

In an embodiment of the present application, please refer to FIG. 1 and FIG. 3. The orthographic projection of the second source electrode 115 on the substrate 101 covers the orthographic projection of the channel of the second active layer 104 on the substrate 101, and the orthographic projection of the second drain electrode 118 on the substrate 101 does not overlap the orthographic projection of the channel of the second active layer 104 on the substrate 101. The above-mentioned situation is equivalent to extending a width of the second source electrode 115, while a width of the second drain electrode 118 remains unchanged, so that the second source electrode 115 can shield the channel where external light shines on the second active layer 104.

In another embodiment of the present application, please refer to FIG. 5. A difference between FIG. 5 and FIG. 3 is that the orthographic projection of the second drain electrode 118 on the substrate 101 covers the orthographic projection of the channel of the second active layer 104 on the substrate 101, and the orthographic projection of the second source electrode 115 on the substrate 101 does not overlap the orthographic projection of the channel of the second active layer 104 on the substrate 101. The above-mentioned situation is equivalent to extending the width of the second drain electrode 118, while the width of the second source electrode 115 remains unchanged, so that the second drain electrode 118 can shield the channel where external light shines on the second active layer 104.

In another embodiment of the present application, please refer to FIG. 6. A difference between FIG. 6 and FIG. 3 is that the orthographic projection of the second source electrode 115 on the substrate 101 covers a part of the orthographic projection of the channel of the second active layer 104 on the substrate 101, and the orthographic projection of the second drain electrode 118 on the substrate 101 covers another part of the orthographic projection of the channel of the second active layer 104 on the substrate 101. The above-mentioned situation is equivalent to extending the width of the second source electrode 115 and the width of the second drain electrode 118 at a same time. The second source electrode 115 and the second drain electrode 118 jointly shield the channel where external light shines on the second active layer 104.

Further, the orthographic projection of the second source electrode 115 on the substrate 101 does not overlap the orthographic projection of the second drain electrode 118 on the substrate 101, so as to avoid capacitive coupling caused by an overlap between the second source electrode 115 and the second drain electrode 118.

Please continue to refer to FIG. 1, FIG. 3, FIG. 5, and FIG. 6. The display panel further includes a buffer layer 103. The buffer layer 103 is disposed between the second active layer 104 and the substrate 101. The reading transistor 12 further includes a light-shielding layer 102. The light-shielding layer 102 is disposed between the substrate 101 and the buffer layer 103. An orthographic projection of the light-shielding layer 102 on the substrate 101 covers an orthographic projection of the second active layer 104 on the substrate 101. The second source electrode 115 is electrically connected to the light-shielding layer 102 through a through-hole passing through the second interlayer dielectric layer 112, the first interlayer dielectric layer 108, and the buffer layer 103. It can be understood that the light-shielding layer 102 is a bottom light-shielding layer, which is conducive to reducing irradiation of external light on the reading transistor 12, avoiding intrusion of water vapor on the device, and is conducive to further improving the stability of the reading transistor 12.

In the embodiment, the display panel further includes a signal reading wiring 117. The signal reading wiring 117 and the second drain electrode 118 are disposed on a side of the protective layer 116 away from the substrate 101. The signal reading wiring 117 is electrically connected to the first drain electrode 114 through a via passing through the protective layer 116. The second drain electrode 118 is electrically connected to the second active layer 104 through a via passing through the protective layer 116, the second interlayer dielectric layer 112, and the first interlayer dielectric layer 108. The signal reading wiring 117 and the second drain electrode 118 are disposed in a same layer, so that they can be prepared by a same process, which is conducive to reducing processes and production cost.

Further, each driving unit 2 includes a driving transistor 21. The driving transistor 21 includes a third active layer 119. A material of the third active layer 119 is an oxide semiconductor. The oxygen vacancy concentration of the material of the first active layer 109 is greater than an oxygen vacancy concentration of the material of the third active layer 119. The Fermi energy level of the material of the first active layer 109 is greater than a Fermi energy level of the material of the third active layer 119.

In the embodiment, each film layer of the driving transistor 21 and corresponding film layer of the reading transistor 12 are disposed in a same layer. In detail, a structure of the driving transistor 21 is same as a structure of the reading transistor 12, and the driving transistor 21 and the reading transistor 12 are disposed in a same layer. A reason for the above-mentioned arrangement is that each film layer of the driving transistor 21 can be prepared by a same process with the corresponding film layer of the reading transistor 12, which is conducive to saving a process, simplifying a production process and reducing production cost.

It should be noted that the structure of the driving transistor 21 can refer to the above-mentioned description of the structure of the reading transistor 12, and will not be described here.

An embodiment of the present application further provides a display device. The display device includes the display panel described in the above-mentioned embodiments. The display device may be a mobile phone, a tablet computer, an electronic reader, an electronic display screen, a laptop, a mobile phone, an augmented reality (AR) device/a virtual reality (VR) device, a media player, a wearable device, a digital camera, a vehicle navigator, etc.

Please refer to FIG. 7A to FIG. 7I. An embodiment of the present application further provides a manufacturing method of a display panel, including following steps:

S10, providing a substrate 101; and

S20, forming light-sensing units 1 on the substrate 101, the light-sensing unit 1 includes a light-sensing transistor 11 and a reading transistor 12 connected in series.

The step of forming the light-sensing units 1 on the substrate 101 includes a following step:

forming a first active layer 109 of the light-sensing transistor 11 and a second active layer 104 of the reading transistor 12 on the substrate 101, and a material of the first active layer 109 and a material of the second active layer 104 are both oxide semiconductors.

It should be noted that the display panel of FIG. 3 is taken as an example for description. A preparation process of the light-sensing transistor 11 and the reading transistor 12 can refer to following steps.

S201, forming the light-shielding layer 102 on a side of the substrate 101.

S202, forming the buffer layer 103 covering a side of the light-shielding layer 102 away from the substrate 101.

In detail, please refer to FIG. 7A. A thickness of the light-shielding layer 102 ranges from 500 Å to 2000 Å. Optionally, a material of the light-shielding layer 102 may be one or more combinations of Mo, Mo/Al, Mo/Cu, MoTi/Cu, MoTi/Cu/MoTi, Ti/Al/Ti, Ti/Cu/Ti, Mo/Cu/IZO, IZO/Cu/IZO, and Mo/Cu/ITO. A thickness of the buffer layer 103 ranges from 1000 Å to 5000 Å. Optionally, a material of the buffer layer 103 may be $SiO_x$ or a combination of $SiN_x$ and $SiO_x$.

S203, forming the second active layer 104 on a side of the buffer layer 103 away from the substrate 101.

In detail, please refer to FIG. 7B, the material of the second active layer 104 includes high mobility and high stability semiconductors such as crystalline semiconductors, amorphous oxide semiconductors, or other types of semiconductors. For example, the material of the second active layer 104 may include IGZO, IGZTO, ATZO, lanthanide, or other rare earth metal oxides with low leakage current or wide band gap. In detail, a thickness of the second active layer 104 may range from 300 Å to 500 Å. For example, the thickness of the second active layer 104 may be 300 Å, 350 Å, 400 Å, 450 Å, or 500 Å.

S204, forming the second gate insulating layer 105 covering the second active layer 104 and the third gate insulating layer 120 covering the substrate 101.

S205, forming the second gate electrode 106 on a side of the second gate insulating layer 105 away from the substrate 101, and forming the third gate electrode 107 on a side of the third gate insulating layer away from the substrate 101.

S206, forming the first interlayer dielectric layer 108 covering a side of the second gate electrode 106 and the third gate electrode 107 away from the substrate 101.

Figure 7C:
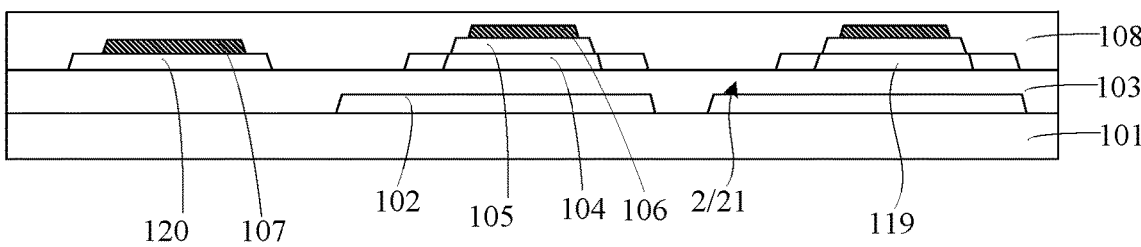

In detail, please refer to FIG. 7C. The second gate insulating layer 105 and the third gate insulating layer 120 are disposed in a same layer and can be prepared by a same yellow light process. A material of the second gate insulating layer 105 and a material of the third gate insulating layer 120 may be one or more combinations of $SiO_x$, $SiN_x$, $Al_2O_3$/$SiN_x$/$SiO_x$, and $SiO_x$/$SiN_x$/$SiO_x$. The second gate electrode 106 and the third gate electrode 107 are disposed in a same layer and may be prepared by a same yellow light process. A material of the second gate electrode 106 and a material of the third gate electrode 107 may be one or more combinations of Mo, Mo/Al, Mo/Cu, MoTi/Cu, MoTi/Cu/MoTi, Ti/Al/Ti, Ti/Cu/Ti, Mo/Cu/IZO, IZO/Cu/IZO, and Mo/Cu/ITO. A material of the first interlayer dielectric layer 108 may be one or more combinations of $SiO_x$, $SiN_x$, $Al_2O_3$/$SiN_x$/$SiO_x$, and $SiO_x$/$SiN_x$/$SiO_x$.

S207, forming the first active layer 109 on a side of the first interlayer dielectric layer 108 away from the substrate 101.

Figure 7D:
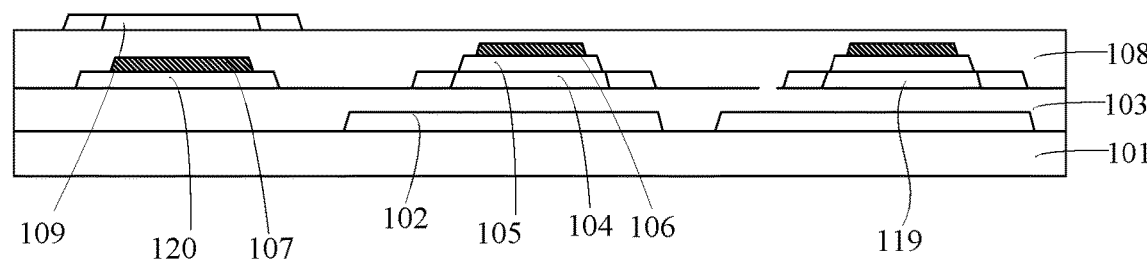

In detail, please refer to FIG. 7D, the material of the first active layer 109 is an amorphous oxide semiconductor with high mobility or other types of semiconductors, and a form of the material may be crystalline or amorphous. For example, the material of the first active layer 109 may include IGTO, IGO, IZO, GTO, or other metal oxides with a high Fermi energy level and narrow band gap.

Specifically, a thickness of the first active layer 109 may range from 300 Å to 500 Å. For example, the thickness of the first active layer 109 may be 300 Å, 350 Å, 400 Å, 450 Å, or 500 Å.

S208, forming the first gate insulating layer 110 on a side of the first active layer 109 away from the substrate 101.

S209, forming the first gate electrode 111 on a side of a first insulating part 1101 away from the substrate 101.

Figure 7E:
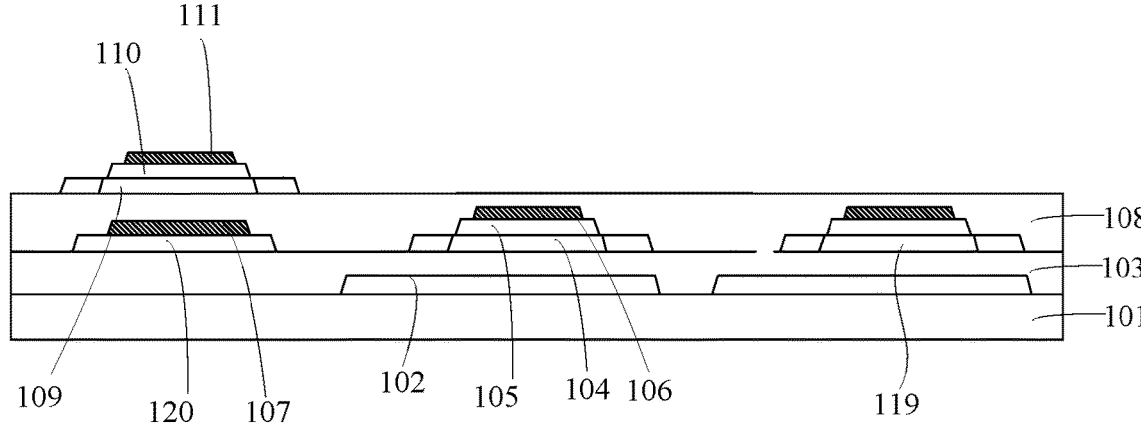

In detail, please refer to FIG. 7E, a material of the first gate electrode 111 may include one or more combinations of a transparent metal or a metal oxide material such as ITO, IZO, AZO, ANCL (a mixture of AL, Ni, Cu, and La), etc.

S210, forming the second interlayer dielectric layer 112 covering a side of the first gate electrode 111 away from the substrate 101.

S211, forming a via passing through the second interlayer dielectric layer 112 and a via passing through the second interlayer dielectric layer 112 and the first interlayer dielectric layer 108.

Figure 7F:
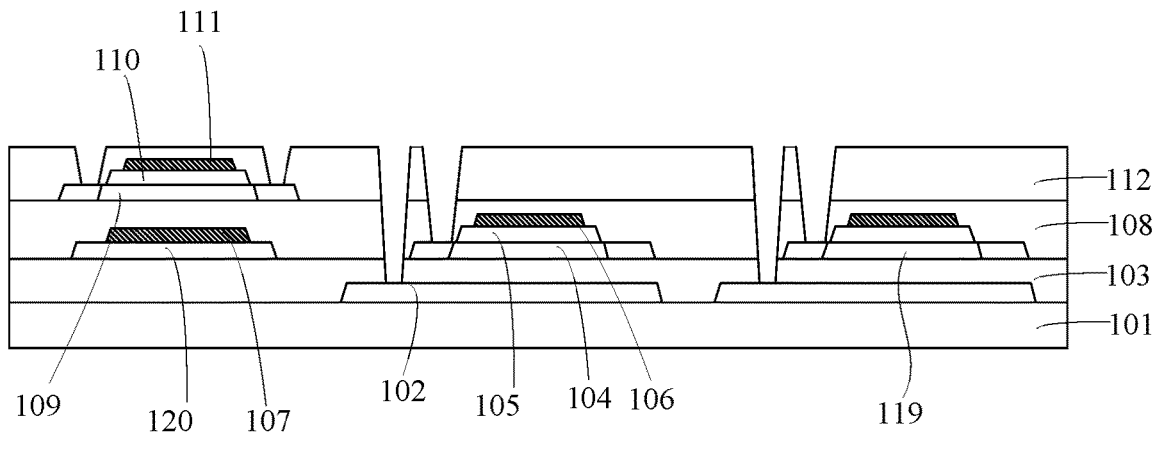

In detail, please refer to FIG. 7F, the second interlayer dielectric layer 112 and the first interlayer dielectric layer 108 may be made of a same material.

S212, forming the first source electrode 113, the first drain electrode 114, and the second source electrode 115 on a side of the second interlayer dielectric layer 112 away from the substrate 101, the first source electrode 113 and the second drain electrode 118 are electrically connected to the first active layer 109 through the via passing through the second interlayer dielectric layer 112, and the second source electrode 115 is electrically connected to the second active layer 104 through the via passing through the second interlayer dielectric layer 112 and the first interlayer dielectric layer 108.

Figure 7G:
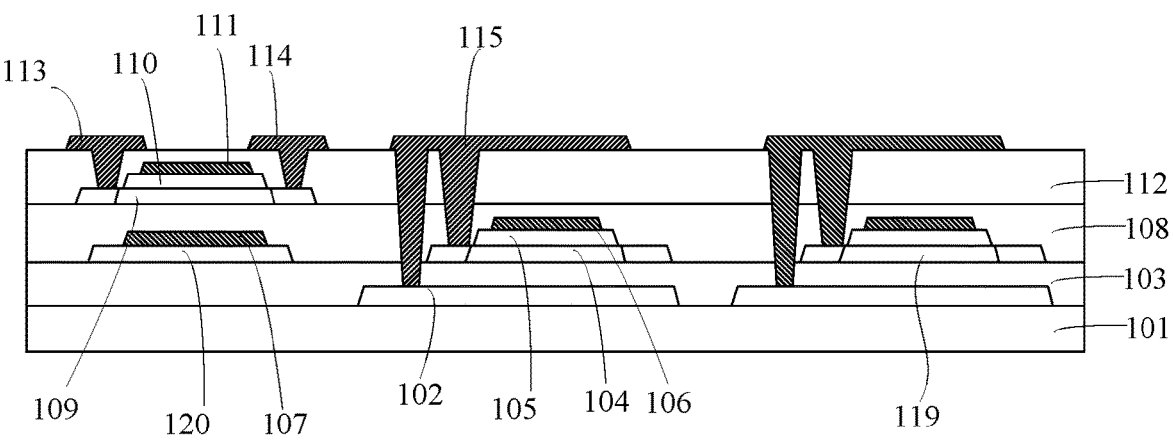

In detail, please refer to FIG. 7G, a material of the first source electrode 113, a material of the first drain electrode 114, and a material of the second source electrode 115 may include one or more combinations of Mo, Mo/Al, Mo/Cu, MoTi/Cu, MoTi/Cu/MoTi, Ti/Al/Ti, Ti/Cu/Ti, Mo/Cu/IZO, IZO/Cu/IZO, and Mo/Cu/ITO.

S213, forming the protective layer 116 covering a side of the first source electrode 113, the first drain electrode 114, and the second source electrode 115 away from the substrate 101.

S214, forming a via passing through the protective layer 116 and a via passing through the protective layer 116, the second interlayer dielectric layer 112, and the first interlayer dielectric layer 108.

Figure 7H:
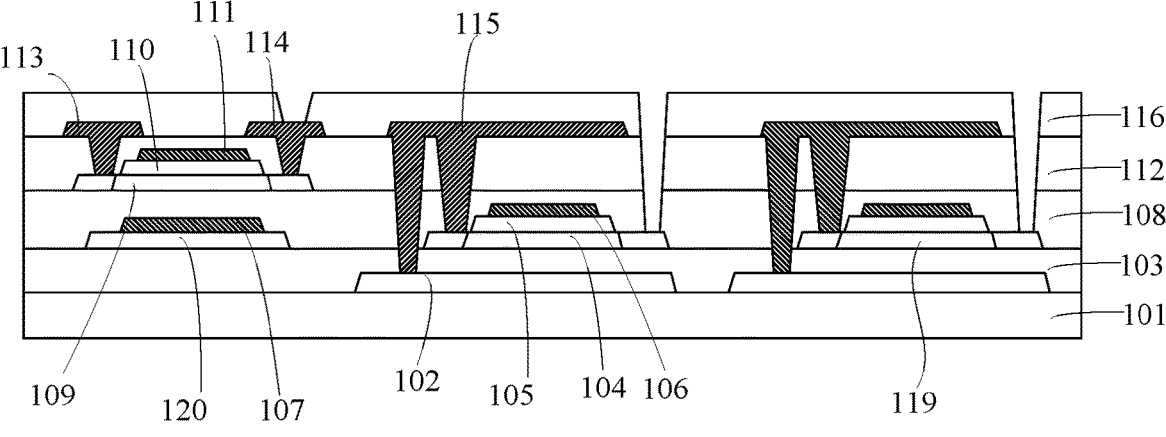

In detail, please refer to FIG. 7H, the first drain electrode 114 and the second source electrode 115 are disposed in different layers.

S215: forming the signal reading wiring 117 and the second drain electrode 118 on a side of the protective layer 116 away from the substrate 101. The signal reading wiring 117 is electrically connected to the first drain electrode 114 through the via passing through the protective layer 116, and the second drain electrode 118 is electrically connected to the second active layer 104 through the via passing through the protective layer 116, the second interlayer dielectric layer 112, and the first interlayer dielectric layer 108.

Figure 7I:
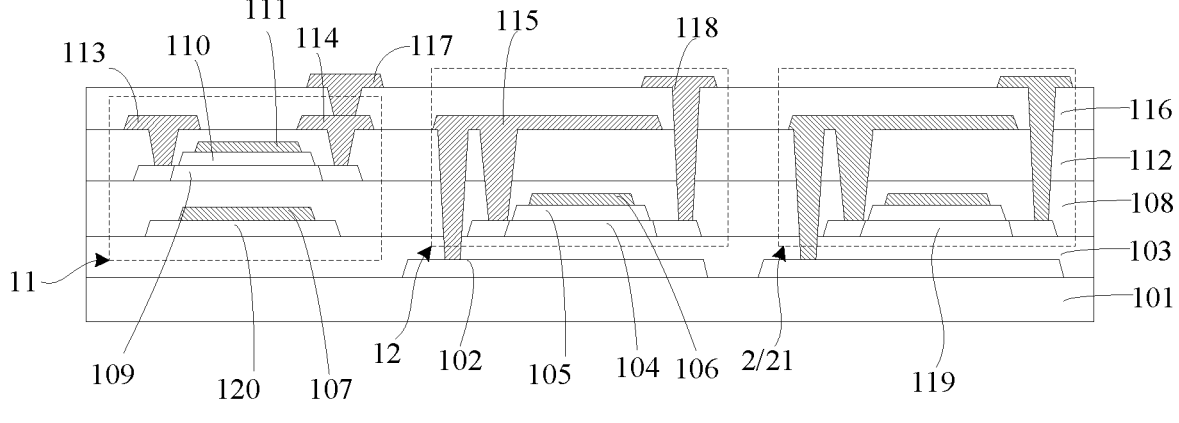

In detail, please refer to FIG. 7I, a material of the signal reading wiring 117 and a material of the second drain electrode 118 include one or more combinations of ITO, IZO, ITO/Ag/ITO, IZO/Ag/IZO, Mo/Cu, and MoTi/Cu/MoTi.

Beneficial effects of the embodiments of the present application are as following: the display panel and the display device provided by the present application includes the substrate and the plurality of light-sensing units disposed on the substrate, the light-sensing unit includes the light-sensing transistor and the reading transistor connected in series. Compared with the prior art in which a material of the first active layer is amorphous silicon and a material of the second active layer is an oxide semiconductor, by adopting oxide semiconductors as the material of the first active layer of the light-sensing transistor and the material of the second active layer of the reading transistor, the defect of poor process compatibility between the amorphous silicon and the oxide semiconductor can be overcame, which is conducive to improving stability of devices.

To sum up, although the present application has been disclosed as above with the preferred embodiments, the above preferred embodiments are not intended to limit the present application. Ordinary technicians in the art can make various changes and embellishments without departing from a spirit and a scope of the present application. Therefore, the scope of protection of the present application is subject to the scope defined in the claims.

What is claimed is:

1. A display panel, comprising a substrate, a plurality of light-sensing units disposed on the substrate, and a driving unit disposed on the substrate, wherein each of the light-sensing units comprises a light-sensing transistor and a reading transistor connected in series, the light-sensing transistor comprises a first active layer, and the reading transistor comprises a second active layer; and wherein a material of the first active layer and a material of the second active layer are both oxide semiconductors;

wherein the driving unit comprises a driving transistor, the driving transistor comprises a third active layer, and a material of the third active layer is an oxide semiconductor; and wherein an oxygen vacancy concentration of the material of the first active layer is greater than an oxygen vacancy concentration of the material of the third active layer, and a Fermi energy level of the material of the first active layer is greater than a Fermi energy level of the material of the third active layer.

2. The display panel of claim 1, wherein a Fermi energy level of the material of the first active layer is greater than a Fermi energy level of the material of the second active layer, and an oxygen vacancy concentration of the material of the first active layer is greater than an oxygen vacancy concentration of the material of the second active layer.

3. The display panel of claim 1, wherein the light-sensing transistor further comprises a first gate insulating layer and a first gate electrode, the first gate insulating layer covers the first active layer, and the first gate electrode is disposed on a side of the first gate insulating layer away from the substrate, and wherein the first gate electrode is made of a transparent material.

4. The display panel of claim 3, wherein the reading transistor further comprises a second gate insulating layer and a second gate electrode, the second gate insulating layer covers the second active layer, and the second gate electrode is disposed on a side of the second gate insulating layer away from the substrate, and wherein the second gate electrode is made of an opaque material.

5. The display panel of claim 4, wherein the display panel further comprises a first interlayer dielectric layer, the first active layer is disposed on a side of the first interlayer dielectric layer away from the substrate, and the first interlayer dielectric layer covers the second gate electrode.

6. The display panel of claim 5, wherein the light-sensing transistor further comprises a first source electrode and a first drain electrode, and the reading transistor further comprises a second source electrode and a second drain electrode;

wherein the display panel further comprises a second interlayer dielectric layer, the second interlayer dielectric layer covers the first gate electrode, and the first source electrode, the first drain electrode, and the second source electrode are all disposed on a surface of a side of the second interlayer dielectric layer away from the substrate; and wherein an orthographic projection of one of the second source electrode and the second drain electrode on the substrate covers an orthographic projection of a channel of the second active layer on the substrate.

7. The display panel of claim 6, wherein the display panel further comprises a protective layer, the protective layer covers the first source electrode, the first drain electrode, and the second source electrode; and wherein the second drain electrode is disposed on a surface of a side of the protective layer away from the substrate and is electrically connected to an end of the second active layer through a via passing through the protective layer, the second interlayer dielectric layer, and the first interlayer dielectric layer.

8. The display panel of claim 6, wherein an orthographic projection of another one of the second source electrode and the second drain electrode on the substrate does not overlap with the orthographic projection of the channel of the second active layer on the substrate.

9. The display panel of claim 4, wherein the display panel further comprises a buffer layer, and the buffer layer is disposed between the second active layer and the substrate; and the light-sensing transistor further comprises a third gate insulating layer and a third gate electrode, the third gate insulating layer is disposed on a surface of a side of the buffer layer away from the substrate, the third gate electrode is disposed on a surface of a side of the third gate insulating layer away from the substrate, and the first interlayer dielectric layer covers the third gate electrode.

10. The display panel of claim 9, wherein the reading transistor further comprises a light-shielding layer, the light-shielding layer is disposed between the substrate and the buffer layer, and an orthographic projection of the light-shielding layer on the substrate covers an orthographic projection of the second active layer on the substrate; and wherein the second source electrode is electrically connected to the light-shielding layer through a through-hole passing through the second interlayer dielectric layer, the first interlayer dielectric layer, and the buffer layer.

11. The display panel of claim 1, wherein each film layer of the driving transistor and corresponding film layer of the reading transistor are disposed in a same layer.

12. The display panel of claim 5, wherein the light-sensing transistor further comprises a first source electrode and a first drain electrode, and the reading transistor further comprises a second source electrode and a second drain electrode;

the display panel further comprises a second interlayer dielectric layer, the second interlayer dielectric layer covers the first gate electrode, and the first source electrode, the first drain electrode, and the second source electrode are all disposed on a surface of a side of the second interlayer dielectric layer away from the substrate; and an orthographic projection of the second source electrode on the substrate covers an orthographic projection of a channel of the second active layer on the substrate, and an orthographic projection of the second drain electrode on the substrate does not overlap the orthographic projection of the channel of the second active layer on the substrate.

13. The display panel of claim 5, wherein the light-sensing transistor further comprises a first source electrode and a first drain electrode, and the reading transistor further comprises a second source electrode and a second drain electrode;

wherein the display panel further comprises a second interlayer dielectric layer, the second interlayer dielectric layer covers the first gate electrode, and the first source electrode, the first drain electrode, and the second source electrode are all disposed on a surface of a side of the second interlayer dielectric layer away from the substrate; and wherein an orthographic projection of the second drain electrode on the substrate covers an orthographic projection of a channel of the second active layer on the substrate, and an orthographic projection of the second source electrode on the substrate does not overlap the orthographic projection of the channel of the second active layer on the substrate.

14. The display panel of claim 5, wherein the light-sensing transistor further comprises a first source electrode and a first drain electrode, and the reading transistor further comprises a second source electrode and a second drain electrode;

wherein the display panel further comprises a second interlayer dielectric layer, the second interlayer dielectric layer covers the first gate electrode, and the first source electrode, the first drain electrode, and the second source electrode are all disposed on a surface of a side of the second interlayer dielectric layer away from the substrate; and wherein an orthographic projection of the second source electrode on the substrate covers a part of an orthographic projection of a channel of the second active layer on the substrate, and an orthographic projection of the second drain electrode on the substrate covers another part of the orthographic projection of the channel of the second active layer on the substrate.

15. The display panel of claim 7, wherein the display panel further includes a signal reading wiring, the signal reading wiring and the second drain electrode are disposed on a side of the protective layer away from the substrate, and the signal reading wiring is electrically connected to the first drain electrode through a via passing through the protective layer.

16. The display panel of claim 15, wherein the signal reading wiring and the second drain electrode are disposed in a same layer.

17. The display panel of claim 1, wherein a plurality of driving units are provided and a plurality of pixel units are provided, the plurality of driving units are disposed in an array and the plurality of pixel units are disposed in an array, and one of the driving units is electrically connected to at least one of the pixel units.

18. A display panel, comprising a substrate and a plurality of light-sensing units and a driving unit disposed on the substrate, wherein each of the light-sensing units comprises a light-sensing transistor and a reading transistor connected in series, the light-sensing transistor comprises a first active layer, the reading transistor comprises a second active layer, the driving unit comprises a driving transistor, and the driving transistor comprises a third active layer; and wherein a material of the first active layer, a material of the second active layer, and a material of the third active layer are all oxide semiconductors, a Fermi energy level of the material of the first active layer is greater than a Fermi energy level of the material of the second active layer and a Fermi energy level of the material of the third active layer, and an oxygen vacancy concentration of the material of the first active layer is greater than an oxygen vacancy concentration of the material of the second active layer and an oxygen vacancy concentration of the material of the third active layer.

19. A display device, comprising a display panel, wherein the display panel comprises a substrate, a plurality of light-sensing units disposed on the substrate, and a driving unit disposed on the substrate, each of the light-sensing units comprises a light-sensing transistor and a reading transistor connected in series, the light-sensing transistor comprises a first active layer, and the reading transistor comprises a second active layer; and wherein a material of the first active layer and a material of the second active layer are both oxide semiconductors;

wherein the driving unit comprises a driving transistor, the driving transistor comprises a third active layer, and a material of the third active layer is an oxide semiconductor; and wherein an oxygen vacancy concentration of the material of the first active layer is greater than an oxygen vacancy concentration of the material of the third active layer, and a Fermi energy level of the material of the first active layer is greater than a Fermi energy level of the material of the third active layer.

20. The display device of claim 19, wherein a Fermi energy level of the material of the first active layer is greater than a Fermi energy level of the material of the second active layer, and an oxygen vacancy concentration of the material of the first active layer is greater than an oxygen vacancy concentration of the material of the second active layer.

* * * * *